United States Patent [19]

Bassous et al.

[11] 4,113,551

[45] Sep. 12, 1978

[54] POLYCRYSTALLINE SILICON ETCHING WITH TETRAMETHYLAMMONIUM HYDROXIDE

[75] Inventors: Ernest Bassous, Riverdale, N.Y.; Cheng-Yih Liu, Woodbridge, Va.

[73] Assignee: International Business Machines Corporation, Armonk, N.Y.

[21] Appl. No.: 861,373

[22] Filed: Dec. 16, 1977

Related U.S. Application Data

[63] Continuation of Ser. No. 743,362, Nov. 19, 1976, abandoned.

[51] Int. Cl.$^2$ .......................................... H01L 21/306
[52] U.S. Cl. .................................... 156/662; 252/79.5
[58] Field of Search ............... 156/662, 647; 252/79.5, 252/547, 544

[56] References Cited

U.S. PATENT DOCUMENTS

| | | | |
|---|---|---|---|
| 3,361,589 | 1/1968 | Lindsey | 156/629 |
| 3,738,881 | 6/1973 | Erdman et al. | 156/647 |
| 3,791,848 | 2/1974 | DeAngelo | 252/79.5 |
| 3,909,325 | 9/1975 | Church et al. | 252/79.5 |

OTHER PUBLICATIONS

*McCutchenson's Detergents and Emulsifiers,* 1969 Annual, p. 105.

*Primary Examiner*—David Klein
*Assistant Examiner*—Jerome W. Massie
*Attorney, Agent, or Firm*—John E. Hoel

[57] ABSTRACT

A family of etchants for polycrystalline silicon based upon an aqueous solution of NR$_4$OH, where R is an alkyl group, has a relatively low etching rate enabling the exercise of better control over the delineation of fine structures.

18 Claims, 2 Drawing Figures

POLYCRYSTALLINE SILICON ETCHING WITH TETRAMETHYLAMMONIUM HYDROXIDE

This is a continuation of application Ser. No. 743,362 filed Nov. 19, 1976, now abandoned.

FIELD OF THE INVENTION

The invention disclosed relates to semiconductor etchants and more particularly relates to an etchant for polycrystalline silicon.

BACKGROUND OF THE INVENTION

Polycrystalline silicon has been a material used in semiconductor structures for some time. Conventionally, chemical vapor deposition techniques are employed where silane is decomposed in an elevated temperature onto the surface of a substrate, forming a layer of polycrystalline silicon, having a grain size in the range of from a few thousand angstroms to 2–3 microns, randomly oriented with respect to the original surface of the substrate. Typical prior art etching solutions for polycrystalline silicon include a solution of nitric acid and buffered hydrofluoric acid. Many problems arise employing prior art etching solutions such as this since its reaction rate is much too fast to provide a reasonable degree of control over the etching process. Prior art etching solutions evolve substantial quantities of heat in their exothermic reaction. Composite structures which include polycrystalline silicon, silicon dioxide and phosphosilicate glass cannot be differentially etched due to the substantially similar etching rates for the respective components by the prior art etchants. Other types of prior art etchants which have been employed for polycrystalline silicon include alkali metals which will contaminate the gate region of field effect transistor structures, for example. Still other prior art polycrystalline silicon etchants employ components which are not stable in air, for example pyrocatechol, is employed as a chelating agent in some prior art solutions and has a short shelf life because it oxidizes rapidly in open air. Still other prior art polycrystalline silicon etchant solutions require the maintenance of critical concentrations for their components, so that the solution must be repeatedly replenished during its use. A particular example of prior art anisotropic etching solutions for monocrystalline silicon is U.S. Pat. No. 3,738,881 to Erdman, et al.

Erdman, et al. teaches the anisotropic etching of monocrystalline silicon with an etchant comprised of an alkaline aqueous solution, an oxidizing agent, and passivating alcohol. Erdman mentions that quaternary ammonium hydroxides, as well as sodium and potassium hydroxides, may be employed in the process. Erdman's patent disclosure is limited to the etching of monocrystalline silicon where he wants to enhance the etching in the [100] direction and suppress etching of the high index phases 211, 311, 331, etc. so as to avoid rounded corners. He suppresses etching of the high index phases by adding alcohol to his solution. In contrast, the subject invention's major application is the etching of polycrystalline silicon isotropically. The 100 and the higher order 211, 311 and 331 phases of each crystallite will be etched by quaternary ammonium hydroxide etchants. If Erdman's solution were applied to etching polycrystalline silicon, those crystallites which do not have their [100] faces exposed, would not be etched at all since Erdman has required the presence of alcohol to suppress the etching of the 211, 311 and 331, etc. phases. Furthermore, Erdman discloses that he cannot etch monocrystalline silicon without the presence of an oxidant because of the formation of [111] pyramids on the 100 phases, which will terminate the etching process. The subject inventive etching solution does not use the oxident nor does it use the passivating alcohol, thereby enabling the solution to successfully etch the polycrystalline silicon isotropically. Erdmen never recognizes the problems of etching polycrystalline silicon.

OBJECTS OF THE INVENTION

It is therefore an object of the invention to provide a polycrystalline silicon etching solution which provides greater control over the etching process.

It is still another object of the invention to provide a polycrystalline silicon etching solution which evolves less heat during the etching process.

It is yet another object of the invention to provide a polycrystalline silicon etching solution which provides greater differential etch rates between polycrystalline silicon, silicon dioxide and phosphosilicate glass.

It is still a further object of the invention to provide polycrystalline silicon etching solution which introduces no alkaline metal ions in the semiconductor environment.

It is still a further object of the invention to provide a polycrystalline silicon etching solution which has a relatively long shelf life.

It is yet another object of the invention to provide a polycrystalline silicon etching solution which has a broader range of component concentrations.

SUMMARY OF THE INVENTION

These and other objects, features and advantages of the invention are provided by the aqueous solution of quaternary ammonium hydroxide disclosed herein. The polycrystalline silicon etching solution comprises an aqueous solution of $NR_4OH$, where R is an alkyl group, having a molar concentration in the range of from 0.0001 moles to the solubility limit of the solute. Alternately, polycrystalline silicon etching solutions may comprise an aqueous solution of $N(R_a)_m(R_b)_{4-m}OH$, where $R_a$ is a first alkyl group, $R_b$ is a second alkyl group, and $m$ is an integer from zero to four, having a molar concentration in the range of from 0.0001 moles to the solubility limit. A still further embodiment of the polycrystalline silicon etching solution comprises an aqueous solution of $N(R_m)(H)_{4-m}OH$, where R is an alkyl group and $m$ is an integer from zero to four, having a molar concentration in the range of from 0.0001 moles to the solubility limit. A still further polycrystalline silicon etching composition comprises an aqueous solution of a monoamine selected from the group consisting of:

$R-NH_2, R_2NH, R_3N, R_aR_bNH$ and $(R_a)_2 R_bN$, where
  R, $R_a$ and $R_b$ are alkyl functional groups, where $R_a \neq R_b$ and having a molar concentration in the range of 0.1 molar to the solubility limit.

This improved polycrystalline silicon etching composition results in greater control over the etching progress, less heat evolved during the etching reaction, greater differential etching rate between polycrystalline silicon, silicon dioxide, and phosphosilicate glass, the avoidance of introducing alkaline metal ions, extended shelf life, and a broader range of component concentrations.

DESCRIPTION OF THE FIGURES

These and other objects, features and advantages of the invention can be more particularly understood with reference to the accompanying figures.

DISCUSSION OF THE PREFERRED EMBODIMENT

Etching of monocrystalline and polycrystalline silicon with tetramethylammonium hydroxide solution (TMAH) has been developed.

The etching characteristic of TMAH is similar to that of other basic silicon etchants, notably, KOH, for example, "Bird's Beak in Angled ROS Structures", by E. Bassous and V. Maniscalco, dated Aug. 25, 1975, or ethylendendiamine-pyrocatechol solutions, for example, *Journal of Electrochemical Society*, Vol. 114, pages 965–970 by R. M. Finne and D. L. Klein (1967). However, TMAH solution possesses many desirable features over other basic etchants.

TMAH contains no alkaline metal or alkaline-earth metal ions such as $Na^+$, $K^+$, $Li^+$ and $Ca^+$ which may cause serious contamination especially in MOSFET devices. Furthermore, TMAH can be rinsed away to better than 16 megohm-cm in D.I. water.

Although TMAH has been reported to absorb $CO_2$ in open air, for example, *Merck Index*, page 1028, 1M solution can be used over a long period of time, up to about one month, without noticeable change in etching characteristic. The batch life of the solution can be easily extended with the etching tank covered with a plate.

TMAH is believed to play dual roles in reaction with silicon. The OH ions are believed to react with Si element following the mechanism suggested in the *Journal of Electrochemical Soc.*, Vol. 114, by R. M. Finne and D. L. Klein.

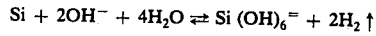

The hydrogen bubbles released can be easily observed and can actually be used as a crude indication of the end point of etching.

The intermediary reaction product $Si(OH)_6^=$ then reacts with TMAH to form water soluble complex silicon salts.

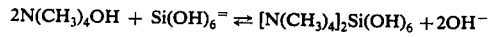

This chelating reaction is somewhat different from that of pyrocatechol which is added to enhance the etching of silicon in the case of ethylenediamine or hydrazine solution. The anion exchange mechanism is therefore suggested here based on the fact that most of anion exchange resins are the derivatives of quaternary ammonium compounds, for example, *Ann. N. Y. Acad. Sci.*, Vol. 57, pages 144–158 by S. Peterson (1954). This suggestion is particularly supported by the fact that addition of $NH_4OH$ increases the etch rate substantially.

Figure 1:
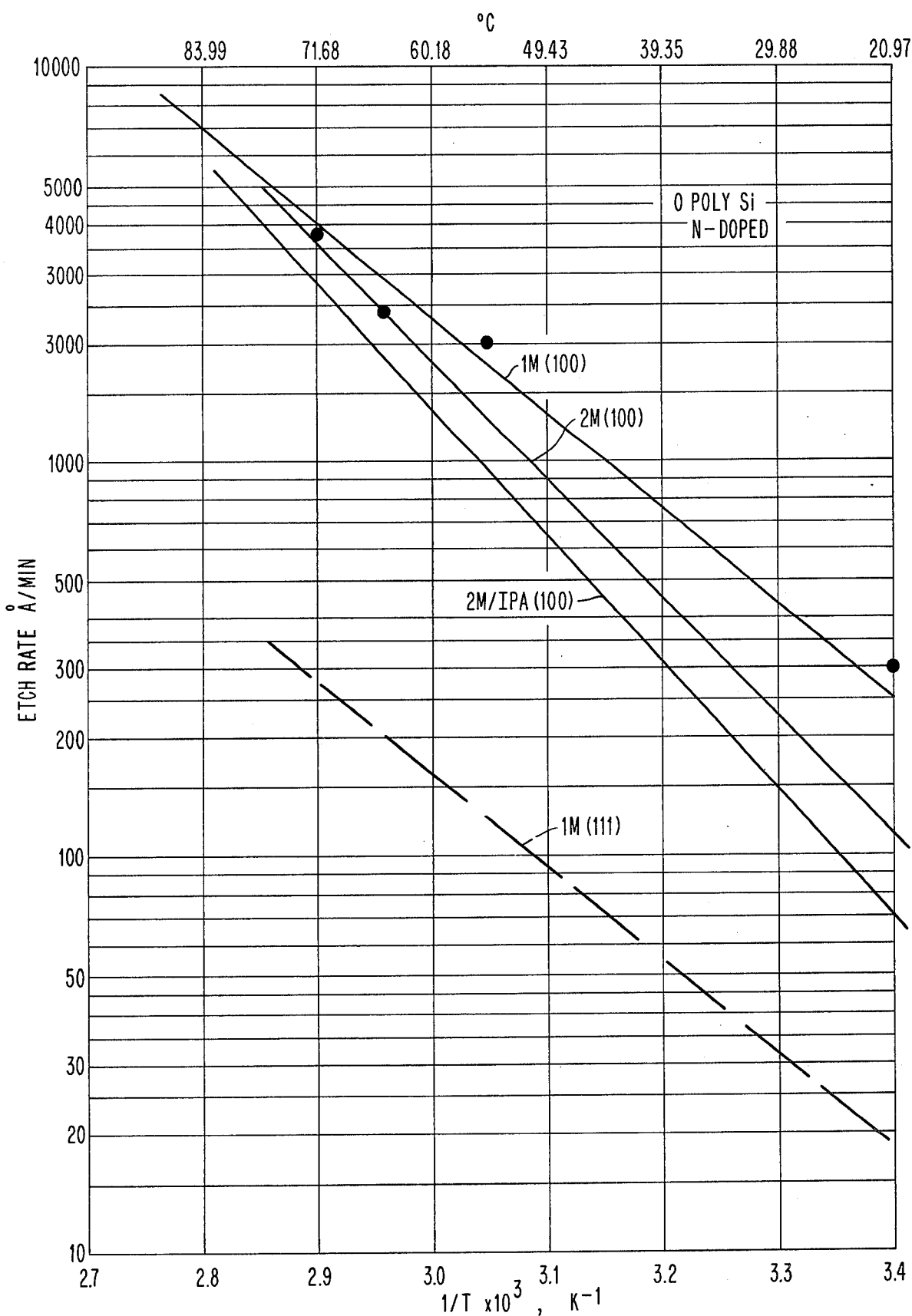
FIG. 1 shows the temperature dependence of etch rates of silicon for the etching solution invention.

The temperature dependence of the etch rates of silicon is shown in FIG. 1. It is interesting to note that the etch rates of CVD polycrystalline silicon layer, deposited at about 650° C. from $SiH_4$, follow the rates of the [100] face of single crystal silicon and the etch rates of the [100] face are dependent of the type of doping, FIG. 1. The difference in the activation energies of 1M and 2M solutions indicates that different reaction controlling steps may exist.

Figure 2:
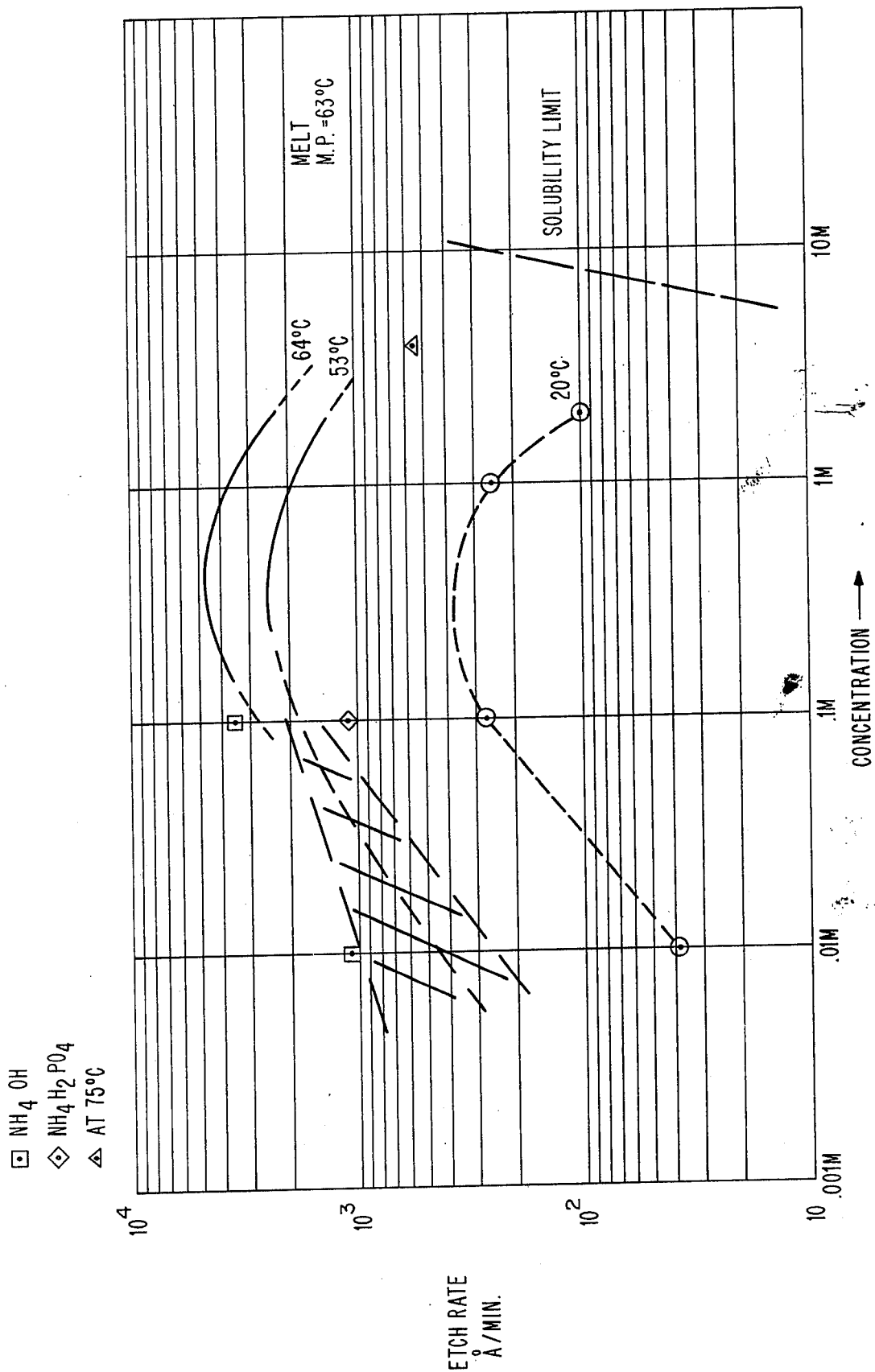
FIG. 2 illustrates the concentration dependence of the etch rate of silicon for the etching solution invention.

The composition dependence of the etch rates reveals one important feature of this etchant. That is the etch rates of the [100] face are relatively constant in the composition range of 0.1M to about 1M and the etch rate decreases as the concentration of TMAH increases from 1M to its solubility limit, FIG. 2. The retardation of chemical reaction in the high concentration range may be attributed to a desorption-controlling mechanism.

In the temperature and composition range studied, TMAH solution does not attack $SiO_2$, poly $SiO_2$ and PSG appreciably. The selectivities of $Si/SiO_2$ and $Si/poly SiO_2$ are measured to be about 1000 whereas that of Si/PSG at temperature below 45° C. is also about 1000, however it decreases as temperature increases. A layer of 500Å poly $SiO_2$ can therefore be used as the etch mask for 10,000Å polysilicon without any damage detectable by an SEM. The etch bias under this condition is about 1.2X. Similar conditions result in a 1.0X etch bias in a 4,000Å layer. In both cases, the etch profile is at 70°.

The polycrystalline silicon etching solution disclosed herein employs as its basic component a reagent of a quaternary ammonium hydroxide. The reagent is dissolved in water. To enhance the dissolution of the products of reaction, a complexing agent can be included in the solution, such as ammonium hydroxide or pyrocathechol. In addition, less than 5% by volume of a surfactant of fluorinated compounds such as Freon 113, a trademark of the DuPont Corporation, (—CCl$_2$F—CClF$_2$—) or hexafluoroisopropanol [—(CF$_3$)$_2$CHOH—], can be added to the solution to enhance the evolution of the gaseous products of reaction from the surface of the silicon being etched. To reduce the rate of the etching reaction and enhance the control over the process, inhibitors can be added to the solution such as ammoniumfluoride, ammonium-biphosphate, hydrogen peroxide, or oxygen. Examples of the various solutions which come within the scope of the inventive etchant are disclosed as follows.

EXAMPLE 1

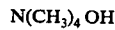

1M aqueous solution at 54° C.
etch rate of (100) Si 1500Å/min
etch rate of (111) Si 100Å/min This aqueous solution of tetramethylammonium hydroxide forms the basic etching composition of the invention.

EXAMPLE 2

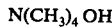

0.1M aqueous solution + 5N $NH_4OH$
etch rate of (100) Si at 54° C. 3500Å/min

In example 2 the complexing agent ammonium hydroxide has been added to the solution to enhance the dissolution of $Si(OH)_6^{--}$, a product of the reaction. The pH of the tetramethylammonium hydroxide aqueous solution itself is 13 whereas the pH of the ammonium hydroxide complexing component is 11, thereby maintaining the hydroxy ion concentration for the aqueous solution of the agent substantially the same.

EXAMPLE 3

$N(CH_3)_4 OH$ 2M aqueous solution + $NH_4F$, 20%
etch rate of (100) Si at 53° C. 1000Å/min In example 3 an inhibitor component of ammonium fluoride has been added to modify the chelation of reaction product on the surface of the polycrystalline silicon being etched so as to reduce the rate of etching process thereby enhancing the control thereover. Other suitable modifiers are $NH_4Br$, $NH_4I$, or $NH_4CL$.

EXAMPLE 4

$N(CH_3)_4 OH$ 2M aqueous solution + $NH_4H_2PO_4$, 25%
etch rate of (100) Si at 53° C. 900Å/min Example 4 is another illustration of the addition of an inhibitor, this time ammonium biphosphate, which results in enhancing the control over the etching process, by the addition of ammonium ion to the solution, reducing the hydroxide ion circuit action. Other ammonium containing compounds would also be suitable, for example, ammonium acetate, $(NH_4) = HPO_4$, or $(NH_4)_3 PO_4$.

EXAMPLE 5

$N(CH_3)_4 OH$ 1M aqueous solution + 25% $H_2O_2$
etch rate of (100) Si at 25° C. 1Å/min Example 5 is a further illustration of the addition of an inhibitor hydrogen peroxide to reduce the etching rate and therefor enhance the control over the etching process. This solution is useful for cleaning silicon. Other oxygent containing oxidants are useful as inhibitors.

EXAMPLE 6

$NH_4OH$ 5M aqueous solution at 40° C.
etch rate of (100) Si 2000Å/min

Example 6 illustrates the use of ammonium hydroxide as the principal etching reagent in an aqueous solution for the etching of polycrystalline silicon. pH of the ammonium hydroxide is approximately 11.

EXAMPLE 7

$NH_4OH$ 5N aqueous solution + $NH_4H_2PO_4$
etch rate of (100) Si at 25° C. 100Å/min In example 7, the inhibiting compound of ammonium diphosphate is added to ammonium hydroxide reagent to reduce the rate of etching, thereby enhancing control.

EXAMPLE 8

$NH_4OH$ 5N aqueous solution + $H_2O_2$ (25° C.)
etch rate of (100) Si at 65° C. 1Å/min In example 8 the strong inhibiting compound hydrogen peroxide is added to the ammonium hydroxide reagent to virtually stop the reaction of slowing down to approximately 1Å per min etch rate, thereby showing the broad range of control that can be exercised over the etching process by the judicious selection of inhibiting compounds.

EXAMPLE 9

$N[R_a]_m[R_b]_{4-m} OH$ $m = 0$
$N(C_2H_5)_4 OH$
1M aqueous solution at 45° C.
etch rate of (100) Si 300Å/min Example 9 illustrates the use of a quaternary ammonium hydroxide etching agent which can be either two different alkyl groups or the same multicarbon chain alkyl group.

EXAMPLE 10

$NH(CH_3)_3 OH$ 1M aqueous solution at 25° C.
etch rate of (100) Si 200Å/min

Example 10 illustrates the use of a quaternary ammonium hydroxide compound having three carbon groups and a hydrogen compound bound to the nitrogen atom, showing the breadth of compounds within the scope of the invention.

EXAMPLE 11

$(CH_3)_3 N$ pH 11
1M aqueous solution at 25° C.
etch rate of (100) Si 20Å/min

Example 11 illustrates the use of an ammine etching agent which, when added to water, hydrolizes into a basic solution of which has a pH of approximately 11.

The resulting aqueous solution of a quaternary ammonium hydroxide reagent with the optional inclusion of a complexing agent, surfactants or inhibitors disclosed above, results in an improved etching solution for polycrystalline silicon. The advantages for the etching solution include the fact that it is organic, containing no potassium or sodium to contaminate the device, it has a long shelf life, greater than 30 days, it has a higher selectivity for oxides and PSG, it etches both N and P type material, it etches polycrystalline silicon deposited on CVD oxide, it requires no special container, it has a low etching temperature, it can be used under very wide concentrations, and no chelating agent is required to sweep out reaction byproducts.

While the invention has been particularly shown and described with reference to the preferred embodiments thereof, it will be understood by those skilled in the art that the foregoing and other changes in form and details may be made therein without departing from the spirit and scope of the invention.

We claim:
1. A method for etching a polycrystalline silicon workpiece, comprising the step of:

applying to the surface of a polycrystalline silicon workpiece, an aqueous solution of $NR_4OH$, containing no separate oxidant, where R is an alkyl group, having a molar concentration in the range of from 0.0001 molar to the solubility limit of the solute at the etching temperature.

2. The method of claim 1, wherein said molar concentration lies within the range of 0.1 and 1.0 molar.

3. The method of claim 1, wherein R is selected from the group consisting of methyl, ethyl, propyl and butyl functional groups.

4. The method of claim 1, wherein said solution further comprises:
ammonium hydroxide added to said aqueous solution, having a molar concentration of from 0.0001 molar to the solubility limit.

5. The method of claim 1, wherein an ammonium halide is added to the aqueous solution to modify the chelation of the reaction product, thereby reducing the etching rate.

6. The method of claim 1, wherein an ammonium ion containing compound is added to the aqueous solution to reduce the etching rate.

7. The method of claim 1, wherein a surfactant comprising a fluorinated compound is added to the solution to enhance the evolution of gaseous products of reaction.

8. A method for etching a polycrystalline silicon workpiece, comprising the step of:
applying to the surface of a polycrystalline silicon workpiece, an aqueous solution of $NH_4OH$, containing no separate oxidant having a molar concentration in the range of from 0.0001 molar to the solubility limit of the solute at the etching temperature.

9. The method of claim 8, wherein said molar concentration lies within the range of 0.1 to 1.0 molar.

10. A method for etching a polycrystalline silicon workpiece, comprising the step of:
applying to the surface of a polycrystalline silicon workpiece, an aqueous solution of $$N[R_a]_m[R_b]_{4-m}OH,$$

containing no separate oxidant, where $R_a$ and $R_b$ are first and second alkyl groups respectively, and $m$ is an integar of from 0 to 4, having a molar concentration in the range of from 0.0001 molar to the solubility limit at the etching temperature.

11. The method of claim 10, wherein said molar concentration lies within the range of 0.1 and 1.0 molar.

12. The method of claim 10, wherein $R_a = R_b$.

13. The method of claim 10, wherein said solution further comprises:
ammonium hydroxide added to said aqueous solution, having a molar concentration of from 0.0001 molar to the solubility limit.

14. A method for etching a polycrystalline silicon workpiece, comprising the step of:
applying to the surface of a polycrystalline silicon workpiece, an aqueous solution of $$N[R]_m[H]_{4-m}.OH,$$

containing no separate oxidant, where R is an alkyl group and $m$ is an integer of from 0 to 4, having a molar concentration in the range of from 0.0001 molar to the solubility limit at the etching temperature.

15. The method of claim 14, wherein said molar concentration lies within the range of 0.1 and 1.0 molar.

16. The method of claim 14, where R is selected from the group consisting of methyl, ethyl, propyl and butyl functional groups.

17. The method of claim 14, wherein a plurality of types of alkyl groups is represented by R.

18. The method of claim 14, wherein said solution further comprises:
ammonium hydroxide added to said aqueous solution, having a molar concentration of from 0.0001 molar to the solubility limit.

* * * * *